US008930153B2

(12) United States Patent
Kagan et al.

(10) Patent No.: US 8,930,153 B2
(45) Date of Patent: *Jan. 6, 2015

(54) METERING DEVICE WITH CONTROL FUNCTIONALITY AND METHOD THEREOF

(75) Inventors: Erran Kagan, Great Neck, NY (US); Tibor Banhegyesi, Baldwin, NY (US); Hai Zhu, Westbury, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 513 days.

This patent is subject to a terminal disclaimer.

(21) Appl. No.: 13/037,953

(22) Filed: Mar. 1, 2011

(65) Prior Publication Data

US 2011/0270551 A1 Nov. 3, 2011

Related U.S. Application Data

(63) Continuation-in-part of application No. 12/036,356, filed on Feb. 25, 2008, now Pat. No. 7,899,630, which is a continuation of application No. 11/341,802, filed on Jan. 27, 2006, now Pat. No. 7,337,081.

(60) Provisional application No. 60/647,669, filed on Jan. 27, 2005.

(51) Int. Cl.
*G01R 15/08* (2006.01)
*G06F 11/30* (2006.01)
*G06F 19/00* (2011.01)
*G01R 22/10* (2006.01)

(52) U.S. Cl.
CPC .......... *G01R 22/10* (2013.01); *G06F 11/30* (2013.01); *G06F 19/00* (2013.01); *G01R 15/08* (2013.01)
USPC ............... 702/64; 324/115; 327/50; 340/662; 361/86; 700/22

(58) Field of Classification Search
CPC ......... G01D 7/00; G01D 21/00; G01R 15/00; G01R 15/002; G01R 115/06; G01R 15/08; G01R 15/10; G01R 22/00; G05B 9/00; G05B 9/02; G06F 11/00; G06F 11/30; G06F 11/32; G06F 17/00; G06F 17/40; G06F 19/00; H01H 35/00; H01H 83/00; H01H 83/10
USPC ............ 324/76.11, 103 R, 103 P, 115, 140 R, 324/140 D, 141, 142, 500, 509, 510, 511; 327/1, 50, 100; 340/500, 540, 635, 340/637, 638, 646, 649, 650, 652, 653, 657, 340/660, 662; 361/1, 18, 23, 30, 31, 35, 38, 361/42, 54, 56, 57, 62, 78, 79, 86, 87, 88, 361/90, 91.1, 600, 601, 602, 603, 659, 673; 700/1, 11, 22, 90, 286, 292, 293, 294, 700/297, 298; 702/1, 57, 58, 60, 61, 64, 702/127, 182, 187, 189; 705/400, 412; 708/100, 105, 200
IPC ........... G01D 7/00,21/00; G01R 15/00, 15/002, G01R 15/06, 15/08, 15/10, 22/00; G05B 9/00, G05B 9/02; G06F 11/00, 11/30, 11/32, 17/00, G06F 17/40, 19/00; H01H 35/00, 83/00, H01H 83/10
See application file for complete search history.

(56) References Cited

U.S. PATENT DOCUMENTS 2,435,753 A 2/1948 Richter et al.
2,606,943 A * 8/1952 Barker .......................... 324/115

(Continued)

FOREIGN PATENT DOCUMENTS

JP 08-247783 9/1996

OTHER PUBLICATIONS

7700 Ion 3-Phase Power Meter, Analyzer and Controller, pp. 1-8, Nov. 30, 2000.

(Continued)

*Primary Examiner* — Edward Cosimano
(74) *Attorney, Agent, or Firm* — Gerald E. Hespos; Michael J. Porco; Matthew T. Hespos

(57) ABSTRACT

A metering device includes a first transformer that receives an analog waveform and generates a first stepped-down output signal; a second transformer that receives the analog waveform and generates a second stepped-down output signal; first biasing circuitry that receives the first output signal from the first transformer and generates a first digital signal within a first range, wherein the first biasing circuitry includes a switching device for switching between a first and second operational sub-range; second biasing circuitry that receives the second output signal from the second transformer and generates a second digital signal within a second range; and a processor assembly in communication with the first biasing circuitry, wherein if the first digital signal saturates the first operational sub-range, the processor assembly controls the switching device to process the first output signal in the second operational sub-range.

49 Claims, 6 Drawing Sheets

(56) References Cited

U.S. PATENT DOCUMENTS

| | | | |
|---|---|---|---|
| 2,883,255 A | 4/1959 | Anderson | |
| 2,987,704 A | 6/1961 | Gimpel et al. | |
| 3,142,820 A | 7/1964 | Daniels | |
| 3,166,726 A * | 1/1965 | Jensen et al. | 334/19 |
| 3,333,194 A | 7/1967 | Batcher | |
| 3,453,540 A | 7/1969 | Dusheck | |
| 3,467,864 A | 9/1969 | Plaats | |
| 3,504,164 A | 3/1970 | Farrell et al. | |
| 3,534,247 A | 10/1970 | Miljanic | |
| 3,535,637 A | 10/1970 | Nils | |
| 3,815,013 A | 6/1974 | Milkovic | |
| 3,824,441 A | 7/1974 | Heyman et al. | |
| 3,995,210 A | 11/1976 | Milkovic | |
| 4,140,952 A | 2/1979 | Miller | |
| 4,246,623 A | 1/1981 | Sun | |
| 4,466,071 A | 8/1984 | Russell | |
| 4,495,463 A | 1/1985 | Milkovic | |
| 4,689,752 A | 8/1987 | Fernandes et al. | |
| 4,841,236 A | 6/1989 | Miljanic et al. | |
| 4,884,021 A | 11/1989 | Hammond et al. | |
| 4,958,640 A | 9/1990 | Logan | |
| 4,996,646 A | 2/1991 | Farrington | |
| 5,006,846 A | 4/1991 | Granville et al. | |
| 5,014,229 A | 5/1991 | Mceachern | |
| 5,166,887 A | 11/1992 | Farrington et al. | |
| 5,170,360 A | 12/1992 | Porter et al. | |
| 5,185,705 A | 2/1993 | Farrington | |
| 5,212,441 A | 5/1993 | Mceachern et al. | |
| 5,220,495 A | 6/1993 | Zulaski | |
| 5,224,054 A | 6/1993 | Wallis | |
| 5,233,538 A | 8/1993 | Wallis | |
| 5,237,511 A | 8/1993 | Caird et al. | |
| 5,298,854 A | 3/1994 | Mceachern et al. | |
| 5,298,855 A | 3/1994 | Mceachern et al. | |
| 5,298,856 A | 3/1994 | Mceachern et al. | |
| 5,298,859 A | 3/1994 | Mceachern et al. | |
| 5,298,885 A | 3/1994 | Mceachern et al. | |
| 5,298,888 A | 3/1994 | Mceachern et al. | |
| 5,300,924 A | 4/1994 | Mceachern et al. | |
| 5,302,890 A | 4/1994 | Mceachern et al. | |
| 5,307,009 A | 4/1994 | Mceachern et al. | |
| 5,315,527 A | 5/1994 | Beckwith | |
| 5,347,464 A | 9/1994 | Mceachern et al. | |
| 5,438,257 A | 8/1995 | Berkcan | |
| 5,459,395 A | 10/1995 | Berkcan | |
| 5,475,628 A | 12/1995 | Adams et al. | |
| 5,514,958 A | 5/1996 | Germer | |
| 5,544,064 A | 8/1996 | Beckwith | |
| 5,559,719 A | 9/1996 | Johnson et al. | |
| 5,568,047 A | 10/1996 | Staver et al. | |
| 5,574,654 A | 11/1996 | Bingham et al. | |
| 5,581,173 A | 12/1996 | Yalla et al. | |
| 5,706,204 A | 1/1998 | Cox et al. | |
| 5,764,523 A | 6/1998 | Yoshinaga et al. | |
| 5,774,366 A | 6/1998 | Beckwith | |
| 5,801,643 A | 9/1998 | Williams et al. | |
| 5,819,203 A | 10/1998 | Moore et al. | |
| 5,822,165 A | 10/1998 | Moran | |
| 5,832,210 A | 11/1998 | Akiyama et al. | |
| 5,874,903 A | 2/1999 | Shuey et al. | |
| 5,898,387 A | 4/1999 | Davis et al. | |
| 5,899,960 A | 5/1999 | Moore et al. | |
| 5,952,819 A | 9/1999 | Berkcan et al. | |
| 5,986,574 A | 11/1999 | Colton | |
| 5,994,892 A | 11/1999 | Turino et al. | |
| 6,018,690 A | 1/2000 | Saito et al. | |
| 6,018,700 A | 1/2000 | Edel | |
| 6,023,160 A | 2/2000 | Coburn | |
| 6,032,109 A | 2/2000 | Ritmiller, III | |
| 6,038,516 A | 3/2000 | Alexander et al. | |
| 6,073,169 A | 6/2000 | Shuey et al. | |
| 6,098,175 A | 8/2000 | Lee | |
| 6,100,817 A | 8/2000 | Mason, Jr. et al. | |
| 6,157,329 A | 12/2000 | Lee et al. | |
| 6,167,329 A | 12/2000 | Engel et al. | |
| 6,186,842 B1 | 2/2001 | Hirschbold et al. | |
| 6,195,614 B1 | 2/2001 | Kochan | |
| 6,289,267 B1 | 9/2001 | Alexander et al. | |
| 6,397,155 B1 | 5/2002 | Przydatek et al. | |
| 6,415,244 B1 | 7/2002 | Dickens et al. | |
| 6,417,661 B1 | 7/2002 | Berkcan et al. | |
| 6,423,960 B1 | 7/2002 | Engelhardt et al. | |
| 6,433,981 B1 | 8/2002 | Fletcher et al. | |
| 6,444,971 B1 | 9/2002 | Engelhardt et al. | |
| 6,479,976 B1 | 11/2002 | Edel | |
| 6,493,644 B1 | 12/2002 | Jonker et al. | |
| 6,519,537 B1 | 2/2003 | Yang | |
| 6,522,517 B1 | 2/2003 | Edel | |
| 6,528,957 B1 | 3/2003 | Luchaco | |
| 6,590,380 B2 | 7/2003 | Edel | |
| 6,615,147 B1 | 9/2003 | Jonker et al. | |
| 6,636,030 B1 | 10/2003 | Rose et al. | |
| 6,657,552 B2 | 12/2003 | Belski et al. | |
| 6,671,635 B1 | 12/2003 | Forth et al. | |
| 6,671,654 B1 | 12/2003 | Forth et al. | |
| 6,671,802 B1 | 12/2003 | Ott | |
| 6,674,379 B1 | 1/2004 | Li et al. | |
| 6,717,394 B2 | 4/2004 | Elms | |
| 6,735,535 B1 | 5/2004 | Kagan et al. | |
| 6,751,563 B2 | 6/2004 | Spanier et al. | |
| 6,792,364 B2 | 9/2004 | Jonker et al. | |
| 6,829,267 B2 | 12/2004 | Vaughan et al. | |
| 6,836,737 B2 | 12/2004 | Petite et al. | |
| 6,842,707 B2 | 1/2005 | Raichle et al. | |
| 6,944,555 B2 | 9/2005 | Blackett et al. | |
| 6,957,158 B1 | 10/2005 | Hancock et al. | |
| 6,961,641 B1 | 11/2005 | Forth et al. | |
| 6,963,195 B1 | 11/2005 | Berkcan | |
| 7,006,934 B2 | 2/2006 | Jonker et al. | |
| 7,010,438 B2 | 3/2006 | Hancock et al. | |
| 7,072,779 B2 | 7/2006 | Hancock et al. | |
| 7,085,824 B2 | 8/2006 | Forth et al. | |
| 7,126,493 B2 | 10/2006 | Junker et al. | |
| 7,174,261 B2 | 2/2007 | Gunn et al. | |
| 7,239,184 B2 | 7/2007 | Cetrulo et al. | |
| 7,243,050 B2 | 7/2007 | Armstrong | |
| 7,304,586 B2 | 12/2007 | Wang et al. | |
| 7,304,829 B2 | 12/2007 | Nadipuram et al. | |
| 7,313,176 B1 | 12/2007 | Groen | |
| 7,337,081 B1 * | 2/2008 | Kagan | 702/60 |
| 7,342,507 B2 | 3/2008 | Jonker et al. | |
| 7,372,574 B2 | 5/2008 | Sanders et al. | |
| 7,436,687 B2 | 10/2008 | Patel | |
| 7,444,454 B2 | 10/2008 | Yancey et al. | |
| 7,511,468 B2 | 3/2009 | Mceachern et al. | |
| 7,514,907 B2 | 4/2009 | Rajda et al. | |
| 7,616,656 B2 | 11/2009 | Wang et al. | |
| 7,761,910 B2 | 7/2010 | Ransom et al. | |
| 7,877,169 B2 | 1/2011 | Slota et al. | |
| 7,899,630 B2 * | 3/2011 | Kagan | 702/60 |
| 7,916,060 B2 | 3/2011 | Zhu et al. | |
| 7,962,298 B2 | 6/2011 | Przydatek et al. | |
| 7,996,171 B2 | 8/2011 | Banhegyesi | |
| 7,999,696 B2 | 8/2011 | Wang et al. | |
| 8,063,704 B2 | 11/2011 | Wu et al. | |
| 8,078,418 B2 | 12/2011 | Banhegyesi et al. | |
| 8,107,491 B2 | 1/2012 | Wang et al. | |
| 8,121,801 B2 | 2/2012 | Spanier et al. | |
| 8,160,824 B2 | 4/2012 | Spanier et al. | |
| 8,190,381 B2 | 5/2012 | Spanier et al. | |
| 8,269,482 B2 * | 9/2012 | Banhegyesi | 324/127 |
| 2002/0032535 A1 | 3/2002 | Alexander et al. | |
| 2002/0129342 A1 | 9/2002 | Kil et al. | |
| 2002/0169570 A1 | 11/2002 | Spanier et al. | |
| 2003/0014200 A1 | 1/2003 | Jonker et al. | |
| 2003/0093429 A1 | 5/2003 | Nishikawa et al. | |
| 2003/0154471 A1 | 8/2003 | Teachman et al. | |
| 2003/0178982 A1 | 9/2003 | Elms | |
| 2003/0187550 A1 | 10/2003 | Wilson et al. | |
| 2003/0226058 A1 | 12/2003 | Miller et al. | |
| 2004/0128260 A1 | 7/2004 | Amedure et al. | |
| 2004/0172207 A1 | 9/2004 | Hancock et al. | |
| 2004/0177062 A1 | 9/2004 | Urquhart et al. | |
| 2004/0193329 A1 | 9/2004 | Ransom et al. | |

(56) References Cited

U.S. PATENT DOCUMENTS

| | | | |
|---|---|---|---|
| 2004/0208182 | A1 | 10/2004 | Boles et al. |
| 2005/0027464 | A1 | 2/2005 | Jonker et al. |
| 2005/0060110 | A1 | 3/2005 | Jones et al. |
| 2005/0093571 | A1 | 5/2005 | Suaris et al. |
| 2005/0144437 | A1 | 6/2005 | Ransom et al. |
| 2005/0165585 | A1 | 7/2005 | Bhateja et al. |
| 2005/0187725 | A1 | 8/2005 | Cox |
| 2005/0273280 | A1 | 12/2005 | Cox |
| 2006/0047787 | A1 | 3/2006 | Agarwal et al. |
| 2006/0052958 | A1 | 3/2006 | Hancock et al. |
| 2006/0066456 | A1 | 3/2006 | Jonker et al. |
| 2006/0083260 | A1 | 4/2006 | Wang et al. |
| 2006/0145890 | A1 | 7/2006 | Junker et al. |
| 2006/0161360 | A1 | 7/2006 | Yao et al. |
| 2006/0267560 | A1 | 11/2006 | Rajda et al. |
| 2007/0058634 | A1 | 3/2007 | Gupta et al. |
| 2007/0067119 | A1 | 3/2007 | Loewen et al. |
| 2007/0067121 | A1 | 3/2007 | Przydatek et al. |
| 2007/0096765 | A1 | 5/2007 | Kagan |
| 2007/0096942 | A1 | 5/2007 | Kagan et al. |
| 2007/0112446 | A1 | 5/2007 | Deveaux et al. |
| 2008/0075194 | A1 | 3/2008 | Ravi et al. |
| 2008/0086222 | A1 | 4/2008 | Kagan |
| 2008/0091770 | A1 | 4/2008 | Petras et al. |
| 2008/0147334 | A1* | 6/2008 | Kagan ............... 702/60 |
| 2008/0172192 | A1 | 7/2008 | Banhegyesi |
| 2008/0215264 | A1 | 9/2008 | Spanier et al. |
| 2008/0234957 | A1 | 9/2008 | Banhegyesi et al. |
| 2008/0235355 | A1 | 9/2008 | Spanier et al. |
| 2008/0238406 | A1 | 10/2008 | Banhegyesi |
| 2008/0238713 | A1 | 10/2008 | Banhegyesi et al. |
| 2009/0012728 | A1 | 1/2009 | Spanier et al. |
| 2009/0072813 | A1* | 3/2009 | Banhegyesi ............... 324/127 |
| 2009/0096654 | A1 | 4/2009 | Zhu et al. |
| 2009/0228224 | A1 | 9/2009 | Spanier et al. |
| 2010/0054276 | A1 | 3/2010 | Wang et al. |
| 2010/0153036 | A1 | 6/2010 | Elwarry et al. |
| 2010/0169876 | A1 | 7/2010 | Mann |
| 2010/0324845 | A1 | 12/2010 | Spanier et al. |
| 2011/0040809 | A1 | 2/2011 | Spanier et al. |
| 2011/0158244 | A1 | 6/2011 | Long et al. |
| 2011/0260710 | A1 | 10/2011 | Zhu et al. |
| 2011/0270551 | A1 | 11/2011 | Kagan et al. |

OTHER PUBLICATIONS

Futura+Series, "Advanced Power Monitoring and Analysis for the 21st Century", Electro Industries/Gauge Tech, specification, 8 pages, Apr. 13, 2000.

IEC 61000-4-15: Electromagnetic compatibility (EMC) Part 4: Testing and measuring techniques, Section 15: Flickermeter—Functional and design specifications; CENELEC—European Committee for Electrotechnical Standardization; Apr. 1998.

ION Technology 7500 ION 7600 ION High Visibility Energy and Power Quality Compliance Meters, specification, Power Measurement, pp. 1-8, revision date Nov. 30, 2000.

ION Technology, 7500 ION High Visibility 3-Phase Energy & Power Quality Meter, Power Measurement, specification, pp. 1-8, revision date Mar. 21, 2000.

ION7550/ion7650 PowerLogic power-monitoring units, Technical data sheets, Copyright 2006 Schneider Electric.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure(r) Technology, Electro Industries/Gauge Tech, specification, 16 pages, Nov. 1999.

Performance Power Meter & Data Acquisition Node, Electro Industries/Gauge Tech, Nexus 1250 specification, 8 pages, Dec. 14, 2000.

PowerLogic Series 4000 Circuit Monitors, pp. 1-4; Document #3020HO0601; Jan. 2006.

User' Installation & Operation and User's Programming Manual, The Futura Series, Electro Industries, pp. 1-64, (c) 1995.

\* cited by examiner

METERING DEVICE WITH CONTROL FUNCTIONALITY AND METHOD THEREOF

This application is a continuation-in-part application of application Ser. No. 12/036,356, filed on Feb. 25, 2008, now U.S. Pat. No. 7,899,630, which is a continuation of application Ser. No. 11/341,802, filed on Jan. 27, 2006, now U.S. Pat. No. 7,337,081, which claims priority under 35 U.S.C. §119 to expired U.S. Provisional Application Ser. No. 60/647,669, filed on Jan. 27, 2005, and entitled "Substation Grade Meter with Circuit Protection Functions", the entire contents of which are expressly incorporated herein in their entirety.

BACKGROUND

This disclosure relates generally to a metering device with control functionality and method thereof, and more particularly to a metering device with control functionality for providing for integration of first and second operations on an input signal within the metering device, wherein the first and second operations have first and second biasing requirements.

An electrical power utility system performs one or more functions, such as generating, transmitting, distributing, measuring, and monitoring energy. Such an electrical power utility system may utilize, for example, a grid of power lines, transformers, circuit breakers, meters, display devices, processors, etc. One type of power utility system is a power substation. Power lines deliver energy to power substations for the power substation to operate on the energy, such as for performing operations including step-up operations, step-down operations, distribution, telemetry, panel annunciation, revenue metering, detection of abnormal energy conditions and/or protection from dangerous energy conditions.

A set of external voltage and/or current transformers provide energy to a power substation equipment, where the equipment may perform more than one operation on the input energy. However, biasing requirements (e.g., component input requirements) for the equipment performing the respective operations are generally substantially different, such due to accuracy requirements and operating ranges needed for the respective operations. For example, panel metering equipment (e.g., for measuring energy usage in real-time and telemetry to an outside destination) and revenue metering equipment (e.g., for accurately measuring energy usage) have first biasing requirements in order for the panel or revenue metering equipment to operate with a high degree of accuracy on a relatively small range of low energy, such as currents ranging between 0-10 amps. Secondary protective circuit relaying equipment (e.g., for protecting equipment in the power substation from dangerous conditions, such as over voltage, under voltage, energy faults, short circuits, reverse power, etc.) have second biasing requirements in order for the protective relaying equipment to operate on a relatively large range of energy, such as currents ranging between 0-100 amps, where a high degree of accuracy is not required.

Due to the difference in biasing requirements, first digital processing equipment having a first internal transformer is used for the metering equipment, generating corresponding output signals and handling the output signals, such as for generating communication transmissions, generating a display to be displayed on a display device, generating control signals, and generating analog retransmit signals. Second digital processing equipment having a second internal transformer is used for detecting dangerous conditions, generating corresponding output signals and handling the output signals, such as for the purpose of communication transmission, display, control of protective devices, such as circuit breakers, and conversion to analog for retransmission of analog signals. The need for first and second digital and/or processing equipment to handle outputs corresponding to metering and condition detection adds to overall cost, including added cost for the additional digital and/or processing equipment, control panel size, wiring time, and complexity of the drawings and schematics. Furthermore, there is a lack of coordination between the metering and protection operations and/or processing or operating on their respective outputs. To overcome the drawbacks in the prior art, it is an aspect of the present disclosure to provide a system and method for sharing equipment to be used in conjunction with performing operations having different input, operating range and/or accuracy requirements.

Furthermore, it is an aspect of the present disclosure to provide a system and method for providing coordination between the metering and protective operations and/or processing or operating on the respective outputs.

SUMMARY

Accordingly, it is an aspect of the present disclosure to provide a system and method for sharing digital and/or processing equipment to be used in conjunction with metering and protective functions.

In accordance with one aspect of the present disclosure, there is provided a metering device of a power substation operating on a secondary analog waveform output by a transformer assembly receiving a primary waveform. The metering device includes a transformer for stepping down the secondary waveform and generating an output signal; first biasing circuitry for operating on the signal output from the transformer for generating a corresponding first digital signal having a value proportional to the signal output from the transformer and within a first range, and second biasing circuitry for operating on the signal output from the transformer for generating a corresponding second digital signal having a value proportional to the signal output from the transformer and within a second range. Additionally, the metering device includes a processor assembly in operative communication with the first and second biasing circuitry, wherein the processor assembly executes application software for receiving the first and second digital signals. The processor assembly includes a first operational software block for processing the first digital and outputting a corresponding first output signal, a second operational software block for processing the second digital signal and outputting a corresponding second output signal, and a control software block for processing the first and second output signals and generating corresponding output.

Pursuant to another aspect of the present disclosure, there is provided a method for operating on a secondary analog waveform output by a transformer assembly receiving a primary waveform. The method includes stepping down the secondary waveform and generating a corresponding output signal; operating on the corresponding output signal for generating a corresponding first digital signal having a value proportional to the signal output from the transformer and within a first range; operating on the corresponding output signal for generating a corresponding second digital signal having a value proportional to the signal output from the transformer and within a second range; processing the first digital signal and outputting a corresponding first output signal; processing the second digital signal and outputting a corresponding second output signal; processing the first and second output signals; and generating output corresponding to the processing of the first and second output signals.

Pursuant to still another aspect of the present disclosure, there is provided a processor assembly executing application software for receiving first and second digital signals corresponding to a secondary waveform output by a transformer assembly of a power substation in response to the transformer assembly operating on a primary waveform. The first digital signal is biased to have a value within a first range, and the second signal is biased to have a value within a second range. The processor assembly includes a first operational software block for processing the first digital signal and outputting a corresponding first output signal; a second operational software block for processing the second digital signal and outputting a corresponding second output signal; and a control software block for processing the first and second output signals and generating corresponding output.

BRIEF DESCRIPTION OF THE DRAWINGS

Various embodiments of the present disclosure will be described herein below with reference to the figures wherein.

DETAILED DESCRIPTION OF THE PREFERRED EMBODIMENTS

Figure 1:
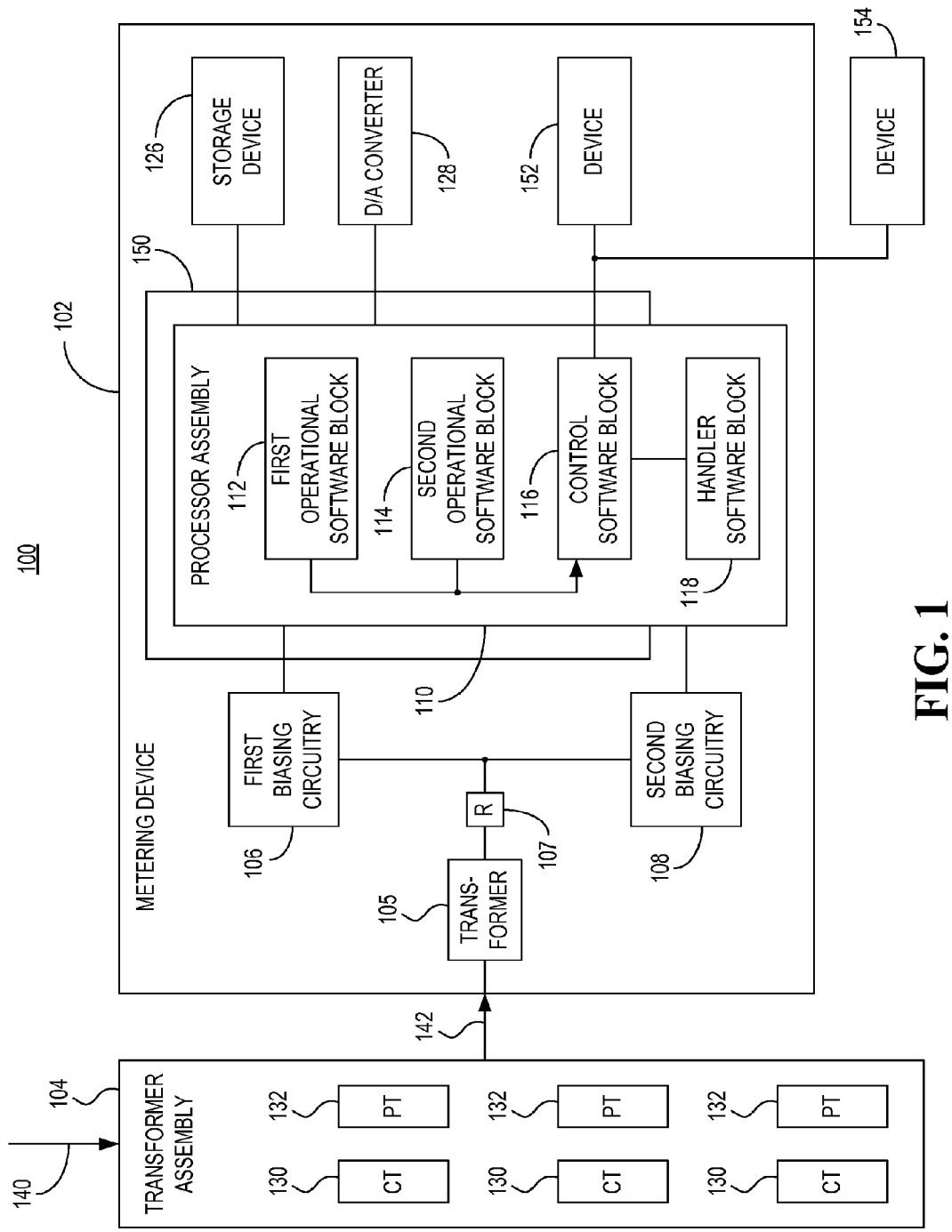
FIG. 1 is a schematic block drawing of a first embodiment of a power substation in accordance with the present disclosure.

For a general understanding of the features of the present disclosure, reference is made to the drawings. In the drawings, like reference numerals have been used throughout to identify identical elements. With reference to FIG. 1, an exemplary power substation 100 is shown having a substation utility metering device 102 and a transformer assembly 104. The substation 100 may perform one or more functions such as transmitting, distributing, stepping-up, stepping-down, measuring, and/or performing protective operations on electrical energy. The metering device 102 includes transformer 105, resistor 107, first biasing circuitry 106, second biasing circuitry 108 and a processor assembly 110. The processor assembly 110 includes a first operational software block 112, a second operational software block 114, a control software block 116, and a handler software block 118. The processor assembly 110 is operatively coupled with a storage device 126 and a digital-to-analog converter (DAC) 128.

The transformer assembly 104 includes at least one current transformer (CT) 130 and at least one potential transformer (PT) 132. A primary waveform 140 is provided to the transformer assembly 104 from a source, such as a power generator station or a power distribution substation (not shown). The transformer assembly 104 operates on the primary waveform 140 and outputs a corresponding secondary waveform 142 which may be provided to a load (not shown) and provided to the metering device 102. The metering device 102 is typically operatively coupled in parallel with signal 142. The CTs 130 and PTs 132 are configured to operate on the primary waveform 140 for transforming the primary waveform 140 into a waveform having a current and potential that have a magnitude that can be operated on by the metering device 102, such as by performing a step-down operation. Furthermore, the PTs 132 are configured to provide a known and accurate voltage via the secondary waveform 142. An exemplary power substation receives a primary waveform 140 having a voltage of 139 kV and a current of 600 amps, and outputs a secondary waveform 142 having a voltage of 120 V and a current of 5 amps.

The processor assembly 110 of the metering device 102 includes at least one processor for executing application software, where the at least one processor may include a digital signal processor (DSP), microprocessor, personal computing device, an application-specific integrated circuit (ASIC), etc. Each of the software blocks 112, 114, 116 and 118 includes a series of programmable instructions capable of being executed by the processor assembly 110. The series of programmable instructions can be stored on a computer-readable medium, such as storage device 126, RAM, a hard drive, CD, smart card, 3.5" diskette, etc., or transmitted via propagated signals for being executed by the processor assembly 110 for performing the functions disclosed herein and to achieve a technical effect in accordance with the disclosure. Additionally, the processor assembly 110 or a portion thereof may not be included in the metering device 102 or the power substation 100, and may be remote from the metering device 102 or the power substation 100.

The functions of the respective software blocks may be distributed among a different combination of software blocks. One or more of the software blocks 112, 114, 116 and 118 may be executed by a dedicated processor of the at least one processor, and a processor of the at least one processor may execute more than one of the software blocks 112, 114, 116 and 118. The processors of the at least one processor operatively communicate with one another via a wired communications, such as a serial bus, or wireless communications, or a shared memory, such as a dual port RAM. Optionally, the first and second operational software blocks 112 and 114 are isolated from one another so that one of the operational software blocks does not interfere with the operation of the other operational software block. As described below, upon detection of an error condition, one of the operational software blocks 112, 114 may be provided with the capability of resetting the other operational software block 112, 114, even when the software blocks 112 and 114 are otherwise isolated. The isolation may be functional and based on software. Furthermore, in a configuration in which the first and second operational software blocks 112 and 114 are executed by first and second processors, respectively, of the at least one processor, the first and second processors may be operationally and/or physically isolated from one another.

In one embodiment of the present disclosure, the processor(s) of the processor assembly 110 that execute the first operational software block 112, the second operational software block 114 and the control software block 116 are disposed in a common housing 150. Accordingly, the processors of the first operational software block 112, second operational software block 114 and the control software block 116 share a common physical platform and may be configured in a single physical unit. Housing 150 may further house the transformer 105, the resistor 107, first biasing circuitry 106, the second biasing circuitry 108, the storage device 126, the DAC 128, and/or the processor(s) of the processor assembly 110 that execute the handler software block 118. Accordingly, the entire metering device 102 or selected components thereof may be configured as one physical unit.

The metering device 102 performs a combination of functions including, for example, measuring energy usage per client for revenue purposes (e.g., where the substation is a point of common coupling for billable customers); measuring real-time energy usage, display of real-time energy usage, telemetry of real-time energy usage; and monitoring voltage and current received and operated on by the metering device 102 for determining if the monitored levels are within normal parameters and/or indicate the need for protective measures. The first operational software block 112 performs a first function of the functions of the metering device 102, and the second operational software block 114 performs a second function of the functions of the metering device 102, where the first and second functions have first and second biasing requirements. The control software block 116 operates on outputs from the first and second operational software blocks 112 and 114 in a coordinated fashion. For example, the control software block 116 may store, process and/or generate output based on the output of the first and/or second operational software blocks 112 and 114.

Output generated by the control software block 116 may be provided to storage device 126 for storage thereof, after which it may be further processed by processor assembly 110 or output to a destination. Output generated by the control software block 116 may be provided to DAC 128 for conversion to an analog signal which may be output from the metering device 102, e.g., as an analog retransmit signal for provision to an analog device, such as an older model metering device. Furthermore, output generated by the control software block 116 may be provided as one or more control signals for controlling at least one device, e.g., a relay (not shown), where the at least one device 152 may be integrated with the metering device 102 and/or the at least one device 154 may be external thereto controlled for example by a digital output signal. An example of a device that may be controlled by output generated by the control software block 116 includes a circuit breaker for disabling energy transmission along a selected electrical path.

Additionally, output generated by the control software block 116 may be provided to the handler software block 118, such as for providing the output to one or more devices (not shown). The handler software block 118 may include one or more handlers, such as a communication input/output (I/O) handler, a display handler, and an indicator handler. The communication I/O handler interfaces with a communication I/O device such as an I/O port (not shown), such as for transmitting information serially, in parallel, using an Ethernet protocol, or using an Internet protocol, etc., to a source that is remote or integrated with the metering device 102. Information transmitted via the communication I/O device may be, for example, revenue data measured by one of the operational software blocks 112 or 114.

The display handler interfaces with a display device (e.g., an LCD display, a computer screen, etc., not shown) for providing output generated by the control software block 116 to the display device for display thereof. Accordingly, real-time energy use measured by the metering device 102 or an alert due to a detected condition may be displayed by the display device. The indicator handler interfaces with an indicator device (e.g., an indicator light or audio buzzer device, not shown) for providing output generated by the control software block 116 to the indicator device, such as for alerting an operator upon detection of a condition by the condition detector software block 114.

The control software block 116 may further be operationally coupled with a user interface (UI) handler (which may also be included in the handler software block 118) providing an interface with a user interface device (not shown). The user interface device is operable by an operator for accepting information input by the operator, such as data or user requests. The user interface device may include, for example, a user input device (keyboard, mouse, control switch, etc.) and may interact with a graphical user interface (GUI) displayed via the display device.

The control software block 116 may monitor the first and second operational software blocks 112 and 114 to check for valid operation thereof, such as reconciling output from both of the first and second operational software blocks 112 and 114, including detecting a deviation or discrepancy between the outputs of both operational software blocks 112 and 114 indicative of a malfunction or error condition. The first operational software block 112, the second operational software block 114 and the control software block 116 may each monitor one another for detecting conditions indicative of a malfunction or error, such as by performing parity and/or checksum checks. Each of (or a combination of) the software blocks 112, 114 and 116 may be provided with the capability of performing a reset operation on either or both of the other two software blocks and/or itself in response to detection of a condition indicative of a malfunction or error. Reset lines of the processors of the at least one processor may be tied together, enabling one processor to reset another processor, such as on upon detection of an error condition.

The first and second biasing circuitry 106 and 108 are operatively coupled to the processor assembly 110, and may be wholly or partially integrated with the processor assembly 110 or external thereto. First and second biasing circuitry 106 and 108 each include one or more of the following devices: an analog-to-digital converter (ADC), an amplifier (e.g., an operational amplifier), a driver, filtering circuitry, buffering circuitry, etc.

The secondary waveform 142 is stepped down by transformer 105 and fed through resistor 107, or the equivalent, to the first biasing circuitry 106 and the second biasing circuitry 108. The first biasing circuitry 106 operates on the output from the transformer 105 and resistor 107 for generating a corresponding first biased signal having a current and voltage within a first range of voltages and currents, where the ADC of the first biasing circuitry 106 converts the first biased signal and outputs a first digital signal that has a value within the first range. The second biasing circuitry 108 operates on the output from transformer 105 and resistor 107 for generating a corresponding biased second signal having a current and voltage within a second range of voltages and currents, where the ADC of the second biasing circuitry 106 outputs a second digital signal that has a value within the second range. The second range is substantially larger than (e.g., at least double) the first range for establishing a large and dynamic range without the need for a high degree of accuracy. In contrast, the first range is small and allows for a high degree of accuracy. The first operational software block 112 receives the first digital signal from the first biasing circuitry 106, and the second operational software block 114 receives the second digital signal from the second biasing circuitry 108.

In operation, the transformer assembly 104 receives the primary waveform 140, and transforms the primary waveform 140 into a secondary waveform 142 which is provided to the metering device 102. The secondary waveform 142 is provided to the transformer 105 and resistor 107 which provide output to each of the first and second biasing circuitry 106 and 108. The first biasing circuitry 106 operates on the output from the transformer 105 and resistor 107 for converting it into the first digital signal having a first range, e.g., 0-10 amps, using a first biasing gain, where the first range covers the full range of the nominal or expected secondary waveform 142, but is not substantially more than twice the secondary waveform 142.

The second biasing circuitry 108 operates on the output from the transformer 105 and resistor 107 for converting it into the second digital signal having a second range (of approximately 0-100 amps in the present example) using the second biasing gain, where the second range covers at least two times the full range of the secondary waveform 142, and ten times the full range of the secondary waveform 142 in the present example.

The processor assembly 110 receives the output from the first and second biasing circuitry 106 and 108. The first operational software block 112 is executed by the processor assembly 110 for processing the output from the first biasing circuitry 106 and generating a first output. In the present example, the first operational software block 112 performs a metering operation on the signal received from the first biasing circuitry 106, such as measuring real-time energy usage or cumulative energy usage per customer. The second operational software block 114 is executed by the processor assembly 110 for processing the output from the second biasing circuitry 108 and generating a second output. In the present example, the second operational software block 114 performs a condition detection operation on the signal received from the second biasing circuitry 108, such as detecting conditions indicative of potential danger for protection purposes. In the present example, operation on the signal received from the first biasing circuit 106 by the first operational software block 112 is isolated from operation on the signal received from the second biasing circuit 108 by the second biasing circuit 108, however the disclosure is not limited to such isolation. The control software block 116 processes the first and second output signals for generating outputs, which may include outputs to a display device, communication I/O port, control signals to a device, DAC 128 for generating analog retransmit signals, etc.

Figure 2:
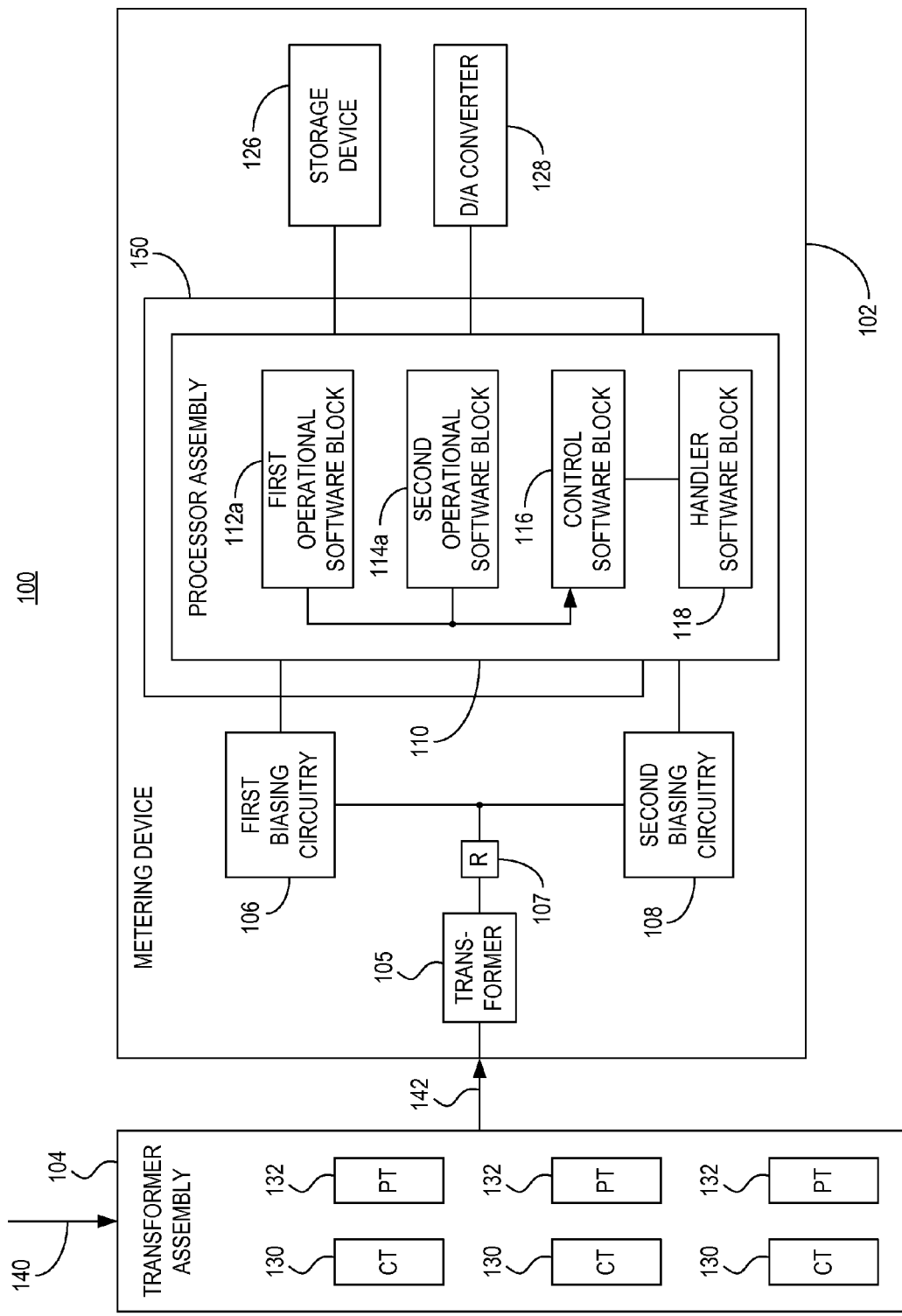
FIG. 2 is a schematic block drawing of a second embodiment of the power substation in accordance with the present disclosure.

With reference to FIG. 2, the first operational software block 112 is shown as an exemplary metering software block 112a that performs digital metering functions, including at least one of measuring energy utilized by a load in real-time (also known as panel metering) and measuring cumulative energy usage per customer (also known as revenue metering). The metering software block 112a receives a digital signal from the first biasing circuitry 106 for looking at the full load (which in the present example ranges between 0-5 amps) that is output as the secondary waveform 142 by the transformer assembly 104 for making highly accurate measurements. In the present example the first range of the ADC of the first biasing circuitry 106 at least covers the range of the full load of the secondary waveform 142, and may be up to substantially double the full load of the secondary waveform 142 (e.g., the first range is about 0-10 amps) for preserving accuracy and preserving the ability to measure levels within the full range of the full load of the secondary waveform 142.

The second operational software block 114 is shown as an exemplary condition detection software block 114a that monitors a digital signal received from the second biasing circuitry 108 for detecting values that are outside of a predetermined range of normal values for determining when a condition exists, such as a condition indicative of a malfunction and the need for protective measures. The condition detection software block 114a needs to look at energy levels that are far outside the expected full load that is output as the secondary waveform 142 (e.g., 0-5 amps), such as for detecting a potentially dangerous condition, such as a short circuit, under voltage condition, over voltage condition, a fault, reverse power, etc. For example, the detection software block may need to look at energy levels that are up to twenty times the full load of the expected secondary waveform 142 (e.g., 0-100 amps) for detecting without the need for a high degree of accuracy. The actual operational software blocks 112 and 114 are not limited to the exemplary software blocks 112a and 114a described above, and may perform other digital and or processing functions. In the present example, the second range covers substantially twenty times the full load of the secondary waveform 142 (e.g., the second range is about 0-100 amps) for establishing a large and dynamic range without the need for a high degree of accuracy.

Figure 3:
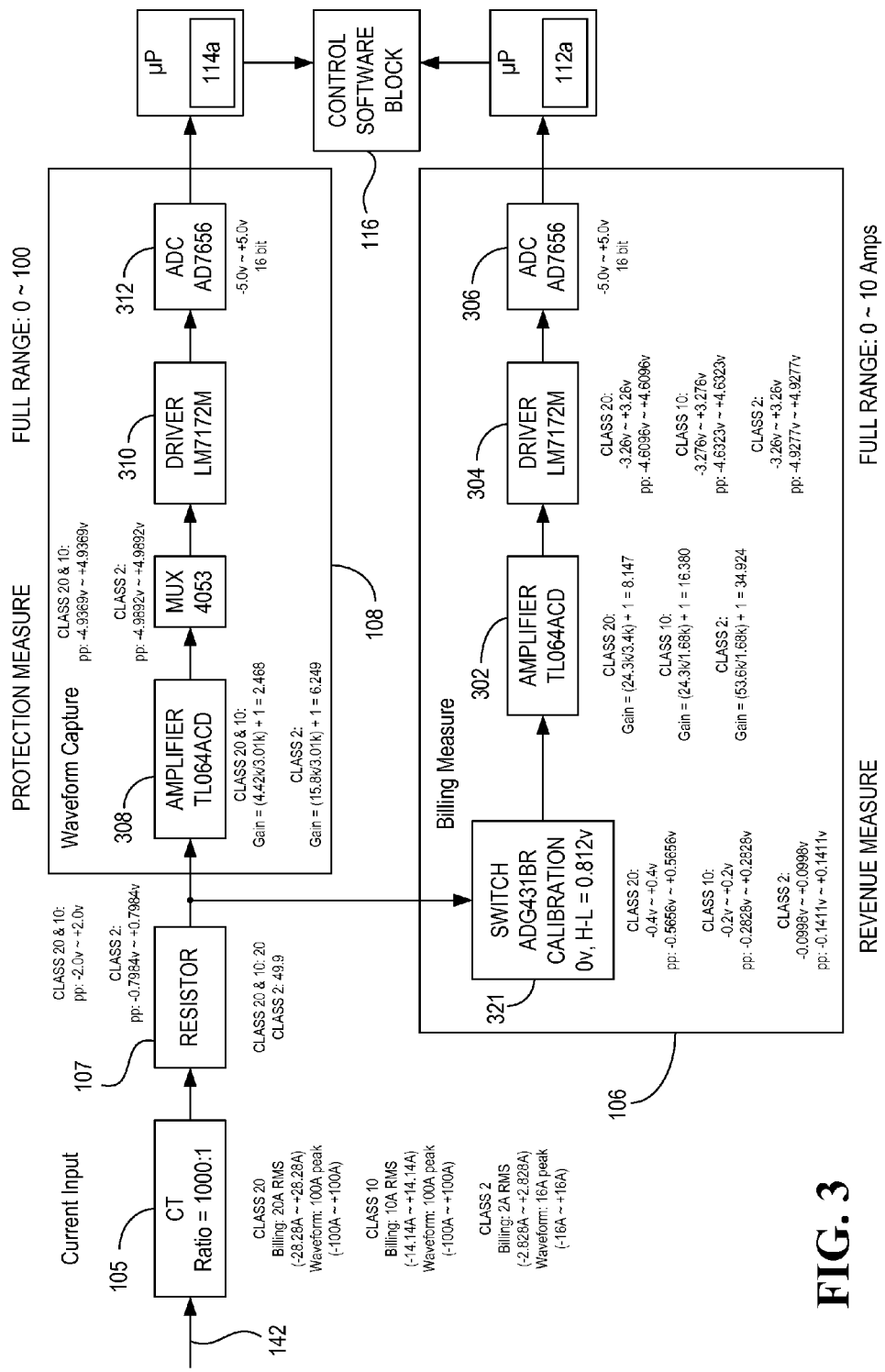
FIG. 3 is a schematic block drawing of a metering device of the power substation shown in FIG. 2.

With reference to FIG. 3, the metering device 102 is shown in greater detail. First biasing circuitry 106 is shown to receive output from transformer 105 and resistor 107, and to include amplifier 302, e.g., a gain amplifier, driver 304 and ADC 306. The output from ADC 306 is provided to a processor executing the metering software block 112a. Second biasing circuitry 108 is shown to receive the same output from transformer 105 and resister 107 as received by the first biasing circuitry 106. The second biasing circuitry 108 is shown to include amplifier 308, e.g., a gain amplifier, driver 310 and ADC 312. The output from ADC 312 is provided to a processor executing the condition protection software block 114a. Control software block 116 receives and processes the output from the processors executing the metering software block 112a and the condition detection software block 114a.

By setting the gain of each amplifier 302, 308, only one transformer 105 is necessary, eliminating the need for first and second transformers. For example, secondary analog waveform 142 will be sensed by current transformer 105 in this exemplary embodiment having a ratio of 1000:1. For transformer 105 provided as a class 2 transformer, after passing resistor 107, the peak-to-peak voltage entering the first and second biasing circuitry 106, 108 will be approximately −0.7984 V to approximately +0.7984 V. The gain of amplifier 302 will be adjusted to provide the desired biasing gain so the output of the amplifier 302 being fed to the ADC 306 will correspond to 0-10 amps with a peak-to-peak signal of approximately −5.0 V to approximately +5.0 V. Since the full range of ADC 306 is measuring the 0-10 amps, the measurement is very accurate and suitable for revenue metering.

The gain of amplifier 308 of the second biasing circuitry 108 will be set to a value to provide the desired biasing gain so the output of the amplifier 308 being fed to the ADC 312 will correspond to 0-100 amps with a peak-to-peak signal of approximately −5.0 V to approximately +5.0 V. Therefore, the full range of ADC 312 is approximately 0 to approximately 100 amps.

Optionally, the first biasing circuitry 106 may include a calibration switch 321 used during initial setup and calibration of the metering device 102. In one state of the switch 321, the first biasing circuitry 106 will receive input as measured by transformer 105, e.g., a normal operation mode. In another state of switch 321, the first biasing circuitry 106 will receive a known reference signal via the switch so the various components, e.g., amplifier 302, ADC 306, etc. can be setup and/or calibrated.

Additionally, the control software block 116 operates on the output from the first operational software block 112 and the second operational software block 114, eliminating the need for separate software blocks and/or processors for processing the output from the first and second operational software blocks 112 and 114. The control software block 116 processes the output from the first and second operational software blocks 112 and 114 in a coordinated fashion. The amount of equipment used is reduced, resulting in lower costs and a compact unit housed in housing 150 within which the processors executing the first operational software block 112, second operational software block 114 and control software block 116 are disposed. Costs are further minimized due to reductions in the complexity and quantity of design, wiring and, installation requirements. The compact unit is versatile, such as for performing metering and condition detection functions.

In a further embodiment, a dual sensing scheme is employed to achieve accurate low and high current sampling. In this embodiment, two current transformers and two corresponding analog-to-digital converters (ADC) are utilized, one for low level current measurements and the other for high level current measurements, i.e., a low range channel and a high range channel. The first current transformer is selected to provide accurate output signals for low signal measurements, i.e., revenue measurements, and the second current transformer is selected to provide accurate output signals for high signal measurements, i.e., waveform capture. Additionally, for the low level current measurements, biasing circuitry is provided including two operational ranges. The processing assembly determines which operational range to employ for processing of revenue measurement calculations. In one embodiment, the processing assembly will determine if the first operation range for revenue measurement is in saturation and, if the first operational range is in saturation, the processing assembly will use the second operational range for processing.

Figure 4:
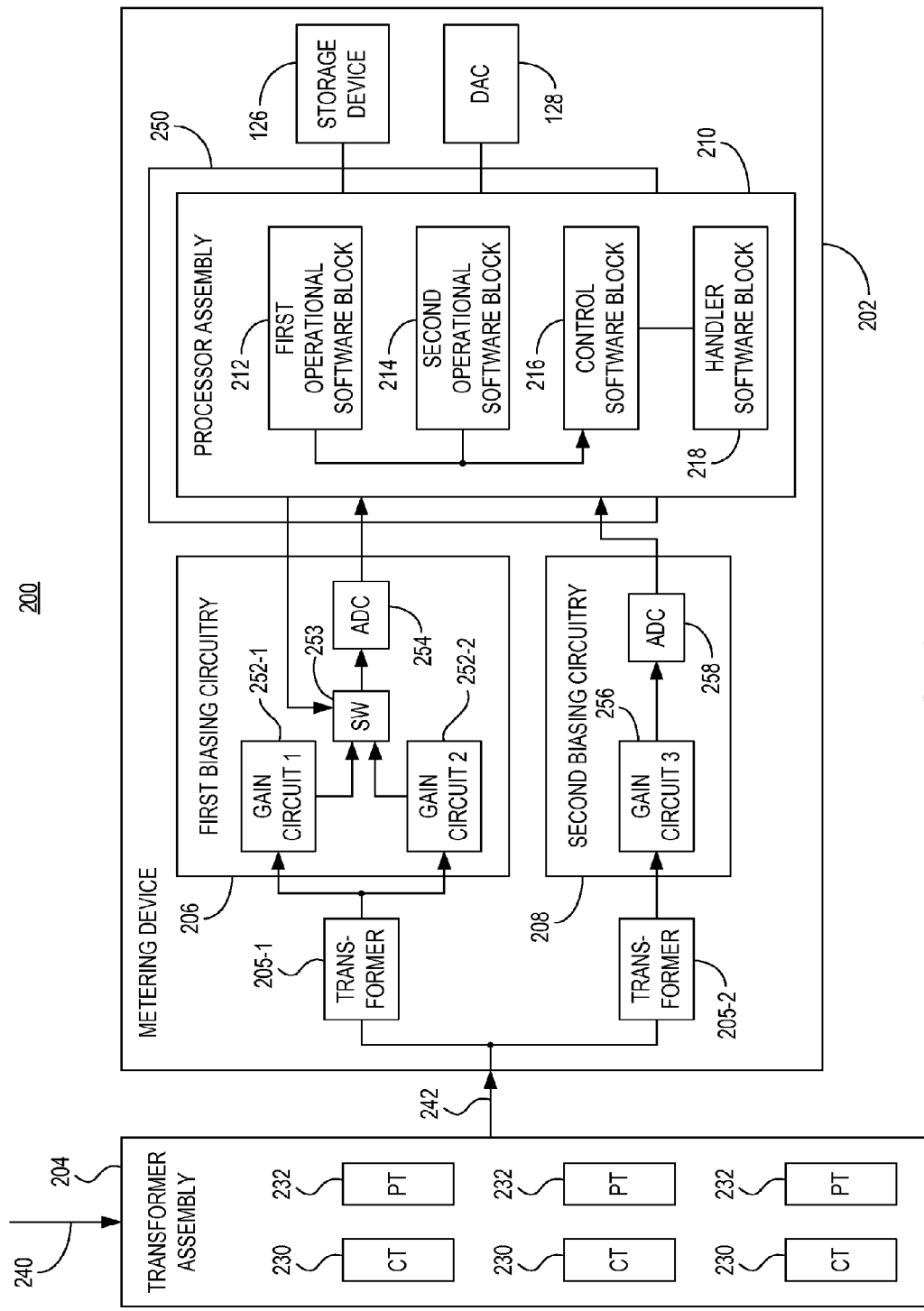
FIG. 4 is a schematic block drawing of a third embodiment of a power substation in accordance with the present disclosure.

Referring to FIG. 4, the transformer assembly 204 of an exemplary power substation 200 operates on a primary waveform 240 and outputs a corresponding at least one secondary waveform 242 provided to the metering device 202. The transformer assembly 204 includes at least one current transformer (CT) 230 and at least one potential transformer (PT) 232. A first current transformer 205-1 and a second current transformer 205-2 are coupled to the transformer assembly 204 to receive the at least one secondary waveform 242, which in this embodiment is at least one current waveform.

First and second biasing circuitry 206 and 208 are operatively coupled to respective current transformers 205-1 and 205-2 and the processor assembly 210, and may be wholly or partially integrated with the processor assembly 210 or external thereto. The processor assembly 210 is at least partially disposed in a common housing 250. First and second biasing circuitry 206 and 208 each include one or more of the following devices: an analog-to-digital converter (ADC), an amplifier (e.g., an operational amplifier), a driver, filtering circuitry, buffering circuitry, switches, a burden resistor, etc. It is to be appreciated that each transformer/biasing circuitry pairing forms a current sensing channel and each phase of a power distribution system being measured will require two channels, i.e., a revenue measurement channel and a waveform power quality measurement channel. For example, for a three phase system, the metering device 202 will include up to eight (8) channels, i.e., at least two for each of the three phases being measured and at least two for the neutral. In one exemplary embodiment, the first channel, i.e., the revenue measurement channel, operates in a range from about zero to about 22 Amps (RMS) and the second channel, i.e., the waveform power quality measurement channel, operates in a range from about zero to about 66.7 Amps (RMS) (about 100 A peak).

The first biasing circuitry 206, i.e., of the revenue measurement channel, operates under a first and second operational range, i.e., first and second sub ranges. For the first operational range, a first gain circuit 252-1 is coupled to analog-to-digital (ADC) converter 254 via switch 253. A second gain circuit 252-2 is provided to handle the second operational range and is coupled to analog-to-digital (ADC) converter 254 via switch 253. Switch 253 is controlled by the processor assembly 210 via an input line of the switch 253. It is to be appreciated that the first and second gain circuits may be two separate and distinct components or may be a single circuit. It is further to be appreciated that each gain circuit is employed to amplify or increase the gain of a signal and may take various forms including but not limited to, a resistor, a burden resistor, an operational amplifier, etc. or any combination thereof. Exemplary biasing circuitry that may be employed as first biasing circuitry 206 is shown and described in commonly owned U.S. patent application Ser. No. 12/211,384, now U.S. Pat. No. 8,269,482, the contents of which are hereby incorporated by reference in its entirety.

In one exemplary embodiment, the first channel covers a range up to 22 Amps (RMS), where the first operational range is from about 1 mA (RMS) to about 2 Amps (RMS) and the second operation range is from about 5 mA (RMS) to above 22 Amps (RMS).

In operation, the transformer assembly 204 receives the primary waveform 240, and transforms the primary waveform 240 into a secondary waveform 242 which is provided to the metering device 202. The secondary waveform 242 is provided to the first transformer 205-1 which provides an output to the first biasing circuitry 206 and is provided to the second transformer 205-2 which provides an output to the second biasing circuitry 208. The first biasing circuitry 206 operates on the output from the transformer 205-1 for converting it into the first digital signal. The processor assembly 210 will monitor the first digital signal to determine which amplifier, i.e., gain, to employ when taking revenue measurements. Initially, the processor assembly 210 will employ the first gain circuit 252-1. If the first digital signal saturates the first operational range, the processor assembly 210 will switch to the second gain circuit 252-2.

The second biasing circuitry 208 operates on the output from the transformer 205-2 and for converting it into the second digital signal having a second range (of approximately 0-100 amps in the present example) using the second biasing gain, where the second range covers at least two times the full range of the secondary waveform 242, and ten times the full range of the secondary waveform 242 in the present example. The second biasing circuitry 208 includes a third gain circuit 256 and analog-to-digital converter (ADC) 258.

An example of switching between operational ranges for revenue measurement will now be described. When the meter starts up, a live 0.5 Amps (RMS) current passes through the meter initially, processor assembly 210 sets switch 253 for employing the first gain circuit 252-1 as a default. Once input current increased to 1.5 Amps (RMS), processor assembly 210 sets switch 253 for employing the second gain circuit 252-2 and continues to employ the second gain circuit 252-2 for revenue measurement as long as current input is larger than 1.5 Amps (RMS). Once the input current decreases to be less than 1.5 Amps (RMS), the processor assembly 210 will set switch 253 for employing the first gain circuit 252-1 again and continue using the first gain circuit 252-1 for revenue measurement as long as current input is less than 1.5 Amps (RMS). In this example, 1.5 Amps (RMS) is the switching threshold, however, the processor assembly 210 can select other points as the switching point as well.

Another embodiment used just for descriptive purposes allows for the processor assembly 210 to utilize a hysteresis to avoid switching between ranges excessively. The processor assembly 210 (which executes instructions included in a first operational software block 212, a second operational software block 214, a control software block 216, and a handler software block 218) will sense the current and determine if the current is above a desired predetermined threshold. For example, if the processor assembly 210 determines that the measured current is above the threshold of 1.5 A, the processor assembly 210 will switch to the second gain circuit. It will hold this setting until the current switches to below 1 Amp, at which time the processor assembly 210 will switch back to the first gain circuit.

By employing the two measurement channels each with a separate current transformer as shown in FIG. 4, the selection of a proper current transformer is not limited by the load driving capability of the current transformer.

Figure 5A:
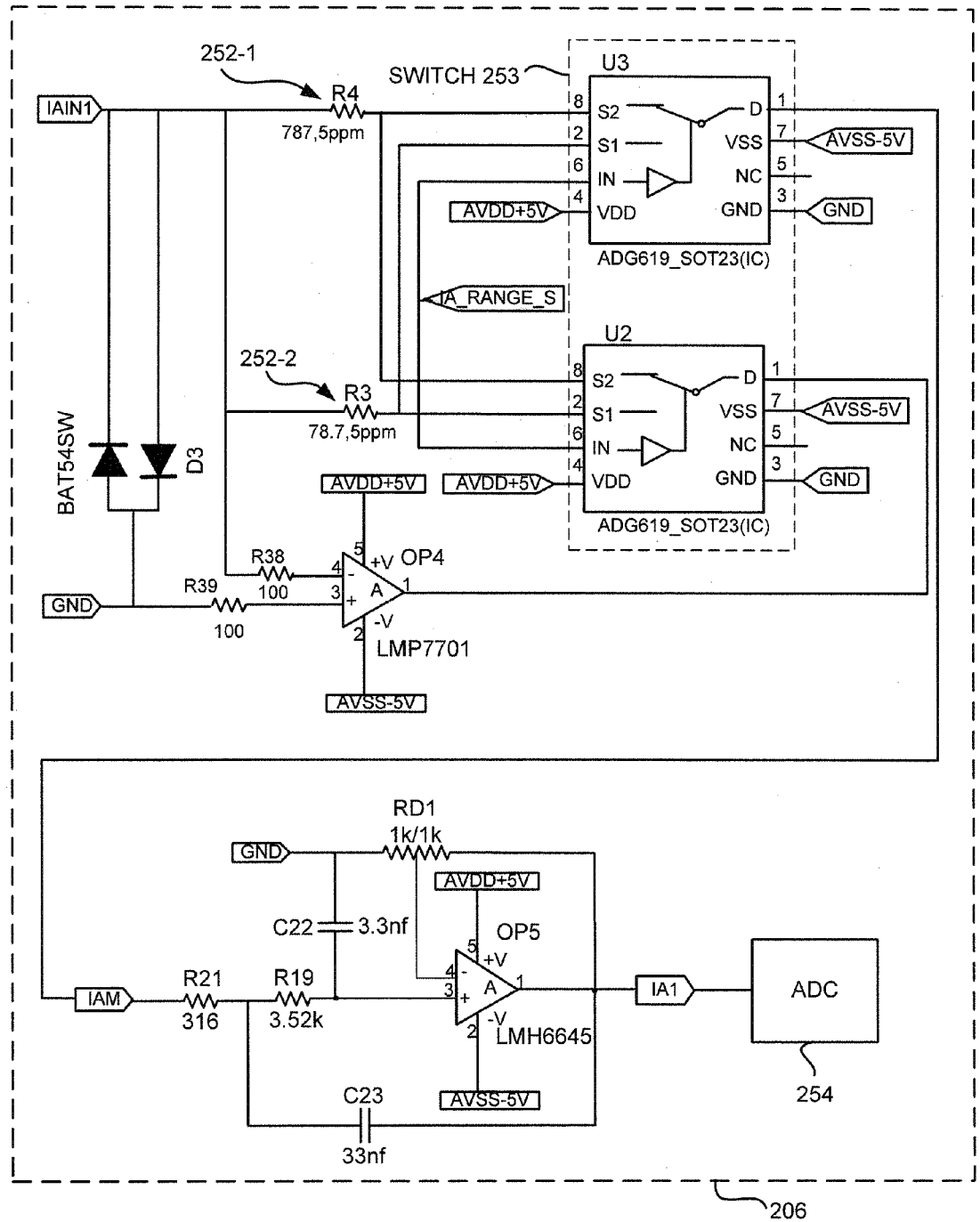
FIGS. 5A and 5B are an exemplary circuit diagram of first and second measurement channels of a metering device in accordance with the present disclosure.
Figure 5B:
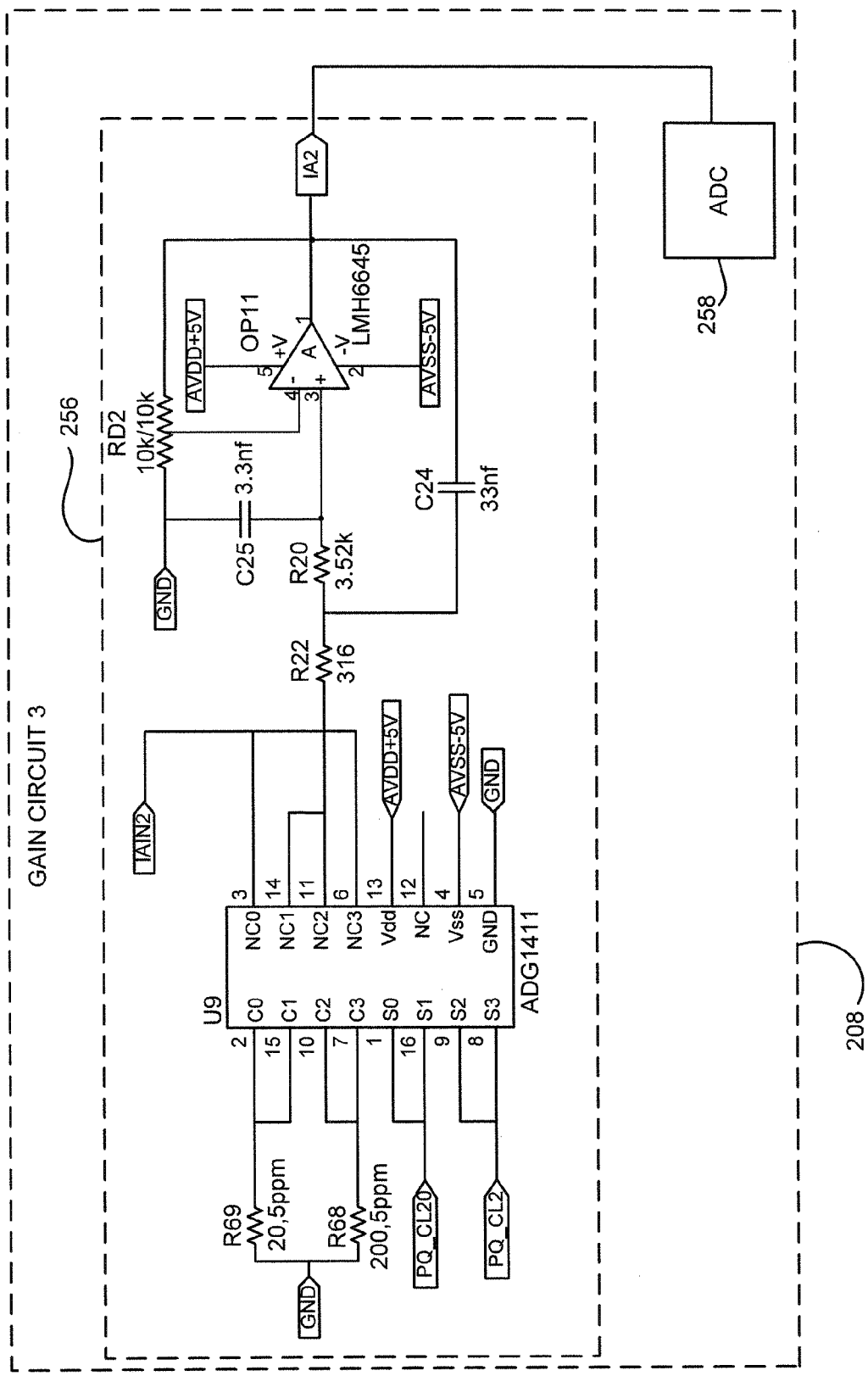

An exemplary circuit diagram of first and second measurement channels of a metering device in accordance with the present disclosure is illustrated in FIGS. 5A and 5B. It is to be appreciated that the circuits in FIGS. 5A and 5B are merely illustrative and the teachings of the present disclosure may be implemented in various ways and is not to be limited to the circuits shown in FIGS. 5A and 5B.

In a further embodiment, the metering device 202 will switch between the first and second channel if the first low range channel becomes saturated. The processor assembly 210 will determine in the first channel, i.e., the revenue measurement channel including transformer 205-1 and first biasing circuitry 206, is in saturation. If the first channel is in saturation, the processor will use the second channel, i.e., the waveform capture channel including transformer 205-2 and second biasing circuitry 208, to perform both revenue measurements and waveform measurements.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A metering device operating on a secondary analog waveform output by an external transformer assembly receiving a primary waveform, the metering device comprising:
a first transformer, wherein the first transformer receives the secondary waveform and generates a first stepped-down output signal;
a second transformer, wherein the second transformer receives the secondary waveform and generates a second stepped-down output signal;
first biasing circuitry, wherein the first biasing circuitry receives the first output signal from the first transformer and generates a first digital signal within a first range, the first digital signal having a value proportional to the first output signal, wherein the first biasing circuitry includes a switching device for switching between a first and second operational sub-range;
second biasing circuitry, wherein the second biasing circuitry receives the second output signal from the second transformer and generates a second digital signal within a second range, the second digital signal having a value proportional to the second output signal; and
a processor assembly in communication with the first biasing circuitry, wherein the processor assembly executes operational software for determining if the first digital signal saturates the first operational sub-range, wherein if the first digital signal saturates the first operational sub-range, the processor assembly controls the switching device to process the first output signal in the second operational sub-range.

2. A metering device operating on a secondary analog waveform output by an external transformer assembly that receives a primary analog waveform, the metering device comprising:
a first transformer, wherein the first transformer is configured to receive the secondary analog waveform and generate a first stepped-down output signal;
a second transformer, wherein the second transformer is configured to receive the secondary analog waveform and generate a second stepped-down output signal;
first biasing circuitry in communication with the first transformer, wherein the first biasing circuitry is configured to receive the first stepped-down output signal from the first transformer and generate a first digital signal within a first range, the first digital signal having a value proportional to the first stepped-down output signal;
second biasing circuitry in communication with the second transformer, wherein the second biasing circuitry is configured to receive the second stepped-down output signal from the second transformer and generate a second digital signal within a second range, the second digital signal having a value proportional to the second stepped-down output signal; and
a processor assembly in communication with the first biasing circuitry and the second biasing circuitry, wherein the processor assembly is configured to receive the first digital signal from the first biasing circuitry and receive the second digital signal from the second biasing circuitry, and wherein the processor assembly is further configured to process the first digital signal and the second digital signal.

3. The metering device of claim 2, wherein the second biasing circuitry comprises a gain circuit and an analog-to-digital converter.

4. The metering device of claim 2, wherein the second range is at least two times greater than the first range.

5. The metering device of claim 2, wherein the first range is from about 0 Amps to about 10 Amps and the second range is from about 0 Amps to about 100 Amps.

6. The metering device of claim 2, wherein the metering device is an energy measurement device for measuring real time energy usage.

7. The metering device of claim 2, wherein the metering device is an protective relaying device for protecting equipment receiving the primary analog waveform.

8. The metering device of claim 2, wherein the first biasing circuitry comprises a switching device.

9. The metering device of claim 8, wherein the first biasing circuitry further comprises a first gain circuit in communication with the first transformer and a second gain circuit in communication with the first transformer, wherein an output from the first gain circuit is provided to a first input of the switching device and an output from the second gain circuit is provided to a second input of the switching device.

10. The metering device of claim 8, wherein the first biasing circuitry further comprises an analog-to-digital converter configured to receive an analog signal from an output of the switching device and convert the analog signal to the first digital signal within the first range.

11. The metering device of claim 8, wherein the processor assembly is configured to switch the switching device between a first operational sub-range and a second operational sub-range, wherein each of the first and second operational sub-ranges covers a portion of the first range.

12. The metering device of claim 11, wherein the second operational sub-range is at least two times greater than the first operational sub-range.

13. The metering device of claim 11, wherein the first operational sub-range is from about 1 mA RMS to about 2 Amps RMS and the second operational sub-range is from about 5 mA RMS to about 22 Amps RMS.

14. The metering device of claim 11, wherein the processor assembly is configured to determine if the first digital signal saturates the first operational sub-range, and wherein, if the processor assembly determines that the first digital signal saturates the first operational sub-range, the processor assembly controls the switching device to process the first stepped-down output signal in the second operational sub-range.

15. The metering device of claim 14, wherein the processor assembly processes the first digital signal to calculate revenue metering measurements and processes the second digital signal to capture waveform measurements.

16. The metering device of claim 11, wherein the processor assembly is configured to switch the switching device to the first operational sub-range when an input current of the first stepped-down output signal is below a predetermined switching threshold and to switch the switching device to the second operational sub-range when the input current of the first stepped-down output signal is at or above the predetermined switching threshold.

17. The metering device of claim 16, wherein the predetermined switching threshold is about 1.5 Amps RMS.

18. The metering device of claim 16, wherein the processor assembly processes the first digital signal to calculate revenue metering measurements and processes the second digital signal to capture waveform measurements.

19. The device of claim 18, wherein the processor assembly determines a need for protective measures when the captured waveform measurements exceed a predetermined range.

20. A system comprising:
a transformer assembly configured to receive a primary analog waveform and output a secondary analog waveform; and
a metering device configured to receive the secondary analog waveform from the transformer assembly;
wherein the metering device comprises:
a first transformer configured to receive the secondary analog waveform and generate a first stepped-down output signal;
a second transformer configured to receive the secondary analog waveform and generate a second stepped-down output signal;
first biasing circuitry configured to receive the first stepped-down output signal and generate a first digital signal within a first range, the first digital signal having a value proportional to the first stepped-down output signal;
second biasing circuitry configured to receive the second stepped-down output signal and generate a second digital signal within a second range, the second digital signal having a value proportional to the second stepped-down output signal; and
a processor assembly configured to receive and process the first digital signal and the second digital signal.

21. The system of claim 20, wherein the metering device is at least one of a panel metering device, a revenue metering device and a protective relaying device.

22. The system of claim 20, wherein the first biasing circuitry comprises a switching device configured to switch between a first operational sub-range and a second operational sub-range, each operational sub-range covering a portion of the first range.

23. The system of claim 22, wherein the first biasing circuitry further comprises:
a first gain circuit having a first gain;
a second gain circuit having a second gain; and
an analog-to-digital converter;
wherein an output from the first gain circuit is provided to a first input of the switching device and an output from the second gain circuit is provided to a second input of the switching device; and
wherein the analog-to-digital converter is configured to receive an analog signal from an output of the switching device and convert the analog signal to the first digital signal.

24. The system of claim 22, wherein the processor assembly is configured to switch the switching device to the first operational sub-range when an input current of the first stepped-down output signal is below a predetermined switching threshold and is configured to switch the switching device to the second operational sub-range when the input current of the first stepped-down output signal is at or above the predetermined switching threshold.

25. The system of claim 24, wherein the processor assembly of the metering device processes the first digital signal to calculate revenue metering measurements and processes the second digital signal to capture waveform measurements.

26. The system of claim 22, wherein the processor assembly is configured to determine if the first digital signal saturates the first operational sub-range and, if so, controls the switching device to process the first stepped-down output signal in the second operational sub-range.

27. The system of claim 26, wherein the processor assembly of the metering device processes the first digital signal to calculate revenue metering measurements and processes the second digital signal to capture waveform measurements.

28. A device comprising:
a first low range current measurement channel, the first low range current measurement channel including a first transformer configured to receive an analog waveform and generate a first stepped-down output signal and first circuitry configured to receive the first output signal and generate a first digital signal within a first range, the first digital signal having a value proportional to the first output signal;
a second high range current measurement channel, the second high range current measurement channel including a second transformer configured to receive the analog waveform and generate a second stepped-down output signal and second circuitry configured to receive the second output signal and generate a second digital signal within a second range, the second digital signal having a value proportional to the second output signal; and
a processor assembly in communication with the first circuitry and the second circuitry, wherein the processor assembly is configured to receive the first digital signal from the first circuitry and receive the second digital signal from the second circuitry, and wherein the processor assembly is further configured to process the first digital signal and the second digital signal.

29. The device of claim 28, wherein the first range is from about 0 Amps to about 10 Amps and the second range is from about 0 Amps to about 100 Amps.

30. The device of claim 28, wherein the first circuitry comprises a switching device.

31. The device of claim 30, wherein the processor assembly is configured to switch the switching device between a first operational sub-range and a second operational sub-range, wherein each of the first and second operational sub-ranges covers a portion of the first range.

32. The device of claim 31, wherein the second operational sub-range is at least two times greater than the first operational sub-range.

33. The device of claim 31, wherein the first operational sub-range is from about 1 mA RMS to about 2 Amps RMS and the second operational sub-range is from about 5 mA RMS to about 22 Amps RMS.

34. The device of claim 31, wherein the first circuitry further comprises a first gain circuit in communication with the first transformer and a second gain circuit in communication with the first transformer, wherein an output from the first gain circuit is provided to a first input of the switching device and an output from the second gain circuit is provided to a second input of the switching device.

35. The device of claim 31, wherein the processor assembly is configured to determine if the first digital signal saturates the first operational sub-range, and wherein, if the processor assembly determines that the first digital signal saturates the first operational sub-range, the processor assembly controls the switching device to process the first stepped-down output signal in the second operational sub-range.

36. The device of claim 35, wherein the processor assembly processes the first digital signal to calculate revenue metering measurements and processes the second digital signal to capture waveform measurements.

37. The device of claim 36, wherein the metering device is at least one of a panel metering device, a revenue metering device and a protective relaying device.

38. The device of claim 31, wherein the processor assembly is configured to switch the switching device to the first operational sub-range when an input current of the first stepped-down output signal is below a predetermined switching threshold and to switch the switching device to the second operational sub-range when the input current of the first stepped-down output signal is at or above the predetermined switching threshold.

39. The device of claim 38, wherein the predetermined switching threshold is about 1.5 Amps RMS.

40. The device of claim 38, wherein the processor assembly processes the first digital signal generated by the first low range current measurement channel to calculate revenue measurements.

41. The device of claim 38, wherein the processor assembly processes the first digital signal to calculate revenue metering measurements and processes the second digital signal to capture waveform measurements.

42. The device of claim 41, wherein the metering device is at least one of a panel metering device, a revenue metering device and a protective relaying device.

43. The device of claim 41, further comprising at least one first low range current measurement and at least one second high range current measurement channel for each phase being measured of a power distribution system.

44. The device of claim 38, wherein the processor assembly processes the second digital signal generated by the second high range current measurement channel to capture waveform measurements.

45. The device of claim 44, wherein the processor assembly determines a need for protective measures when the captured waveform measurements exceed a predetermined range.

46. The device of claim 44, wherein the processor assembly generates a control signal when the captured waveform measurements exceed a predetermined range.

47. The device of claim 46, wherein the control signal is an analog retransmit signal.

48. The device of claim 46, wherein the control signal is provided to a circuit breaker for disabling energy transmission along a selected electrical path.

49. The device of claim 46, further comprising a control device configured to receive the control signal and perform a subsequent control action on at least one external device.

* * * * *